(12) United States Patent
Kondo et al.

(10) Patent No.: US 9,190,584 B2
(45) Date of Patent: Nov. 17, 2015

(54) OPTICAL-SEMICONDUCTOR DEVICE

(75) Inventors: Takashi Kondo, Osaka (JP); Koji Akazawa, Osaka (JP); Takashi Ozaki, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 137 days.

(21) Appl. No.: 13/017,063

(22) Filed: Jan. 31, 2011

(65) Prior Publication Data

US 2011/0186893 A1 Aug. 4, 2011

(30) Foreign Application Priority Data

Feb. 2, 2010 (JP) ................................. 2010-021478

(51) Int. Cl.
| | |
|---|---|
| *H01L 33/50* | (2010.01) |
| *H01L 33/56* | (2010.01) |
| *B29C 43/18* | (2006.01) |
| *H05B 33/04* | (2006.01) |

(52) U.S. Cl.
CPC ............... *H01L 33/56* (2013.01); *B29C 43/18* (2013.01); *H01L 33/50* (2013.01); *H01L 33/505* (2013.01); *H05B 33/04* (2013.01); *H01L 33/507* (2013.01); *H01L 2224/48227* (2013.01); *H01L 2933/005* (2013.01); *Y10T 428/31663* (2015.04)

(58) Field of Classification Search
None
See application file for complete search history.

(56) References Cited

U.S. PATENT DOCUMENTS

| | | | |
|---|---|---|---|
| 5,270,425 | A | 12/1993 | Vanwert et al. |
| 2004/0147681 | A1* | 7/2004 | Arai et al. ................. 525/242 |
| 2004/0213973 | A1 | 10/2004 | Hara et al. |
| 2005/0129957 | A1* | 6/2005 | Kashiwagi et al. .......... 428/413 |
| 2005/0209400 | A1 | 9/2005 | Tsumura et al. |
| 2006/0118973 | A1 | 6/2006 | Harada et al. |
| 2006/0258028 | A1* | 11/2006 | Paolini et al. ................. 438/22 |
| 2008/0003370 | A1 | 1/2008 | Sweet et al. |
| 2008/0197376 | A1* | 8/2008 | Bert et al. ...................... 257/99 |

(Continued)

FOREIGN PATENT DOCUMENTS

| | | |
|---|---|---|
| CN | 101553936 A | 10/2009 |
| EP | 0718432 A1 | 6/1996 |

(Continued)

OTHER PUBLICATIONS

Office Action, dated Oct. 14, 2012, issued by the Japanese Patent Office in counterpart Japanese Patent Application No. 2010-021478.

(Continued)

*Primary Examiner* — Benjamin Sandvik
(74) *Attorney, Agent, or Firm* — Sughrue Mion, PLLC

(57) ABSTRACT

The present invention relates to an optical-semiconductor device, which is prepared by: arranging a sheet for optical-semiconductor element encapsulation including an encapsulating resin layer capable of embedding an optical-semiconductor element and a wavelength conversion layer containing light wavelength-converting particles and being laminated directly or indirectly on the encapsulating resin layer, on an optical-semiconductor element-mounting substrate so that the encapsulating resin layer faces the optical-semiconductor element-mounting substrate; followed by compression-molding, in which the wavelength conversion layer is present on an upper part of a molded body in which the optical-semiconductor element is embedded therein, but is not present on a side surface of the molded body.

4 Claims, 1 Drawing Sheet

(56) References Cited

U.S. PATENT DOCUMENTS

| | | | |
|---|---|---|---|
| 2009/0001399 A1* | 1/2009 | Diana et al. | 257/98 |
| 2009/0002810 A1 | 1/2009 | Jeon et al. | |
| 2009/0236759 A1* | 9/2009 | Kashiwagi | 257/791 |
| 2010/0148378 A1* | 6/2010 | Katayama et al. | 257/791 |
| 2012/0052608 A1* | 3/2012 | Yoo et al. | 438/27 |
| 2012/0319153 A1* | 12/2012 | Matsuda et al. | 257/98 |
| 2014/0178678 A1* | 6/2014 | Katayama et al. | 428/336 |

FOREIGN PATENT DOCUMENTS

| | | | |
|---|---|---|---|
| JP | 2-237141 A | 9/1990 |
| JP | 6-207105 A | 7/1994 |
| JP | 8-209068 A | 8/1996 |
| JP | 2004343149 A | 12/2004 |
| JP | 2006-117919 A | 5/2006 |
| JP | 2006140362 A | 6/2006 |
| JP | 2006-206919 A | 8/2006 |
| JP | 2007-287937 A | 11/2007 |
| JP | 2008-159705 A | 7/2008 |
| JP | 2008-528788 A | 7/2008 |
| JP | 2009-094207 A | 4/2009 |
| JP | 200999784 A | 5/2009 |
| JP | 2009141066 A | 6/2009 |
| JP | 2009524235 A | 6/2009 |
| JP | 2009253223 A | 10/2009 |
| JP | 2010285593 A | 12/2010 |
| WO | 2007/049187 A1 | 5/2007 |

OTHER PUBLICATIONS

Communication issued on Jan. 17, 2012 by the Japanese Patent Office in the counterpart Japanese Patent Application No. 2010-021478.

Communication issued on Feb. 28, 2012 by the Japanese Patent Office in the counterpart Japanese Patent Application No. 2010-024478.

Notification of Reasons for Refusal, dated Jun. 6, 2012, issued by the Japanese Patent Office in counterpart Japanese Application No. 2010-021478.

Explanation of Circumstances Concerning Accelerated Examination in counterpart Japanese Patent Application No. 2010-021478 dated Jan. 17, 2012.

Office Action dated Dec. 18, 2013, issued by the State Intellectual Property Office of the People's Republic of China in counterpart Chinese Application No. 201110035808.X.

Extended European Search Report dated Jun. 24, 2014, issued by the European Patent Office in counterpart European Application No. 11152880.8.

Notification of Second Office Action dated Jul. 18, 2014, issued by the State Intellectual Property Office of the People's Republic of China in counterpart Chinese Application No. 201110035808.X.

Non-Final Office Action issued on Jan. 29, 2015 by the United States Patent and Trademark Office in U.S. Appl. No. 14/068,590.

Notification of Third Office Action dated Dec. 24, 2014 issued by the State Intellectual Property Office of the People's Republic of China in counterpart Chinese Patent Application No. 201110035808.X.

* cited by examiner

OPTICAL-SEMICONDUCTOR DEVICE

FIELD OF THE INVENTION

The present invention relates to an optical-semiconductor device. More particularly, it relates to an optical-semiconductor device batch-encapsulated with a sheet for optical-semiconductor element encapsulation, a sheet for optical-semiconductor element encapsulation to be used in the device and a method for producing the device.

BACKGROUND OF THE INVENTION

By taking the place of incandescent lamp and fluorescent lamp, a light emitting device of an optical semiconductor (light emitting diode, LED) has come into wide use. Though there are various types in the white light LED device, the main stream of the current white light LED device is a light emitting system in which white light is emitted as a mixed color of blue and yellow by using a blue light emitting element and dispersing a phosphor which converts blue color to yellow color in an encapsulating resin.

In recent years, development of light emitting elements is proceeding at a fast pace, and by taking the place of the conventional low luminance white color package mainly including a shell type, a high luminance white color LED package which can also be used in the back light of general lighting fixture and liquid crystal television is becoming the main current. Thus, since the epoxy resin conventionally used as an encapsulating resin causes a problem in that its transparency is lowered due to deterioration by light and heat, a resin having less deterioration, such as silicone, has been used. On the other hand, the silicone resin shows good durability, but in general, it is necessary to mold a package from liquid state so that its poor workability at the time of encapsulation is causing a low throughput and further a high cost.

Based on these reasons, an encapsulation method which uses an encapsulating sheet has been proposed instead of the encapsulation method that uses a liquid matter, so that a sharp improvement of workability has been made. In addition, since the light-extraction efficiency can be improved by arranging a wavelength conversion layer at a place distant from the light emitting element, namely at the outermost side of the package, the method for preparing a package using an encapsulation sheet is drawing attention also from the viewpoint that a uniform wavelength conversion layer can be easily formed in the outermost layer.

Preparation of a package using an encapsulating sheet is generally carried out by putting an encapsulating sheet and a concave mold on a light emitting element in this order and carrying out compression molding. In this case, a uniform wavelength conversion layer is formed on the outermost side of the package in each of the upper side and side surface (lateral part) of the light transmitting element. Accordingly, the light-extraction efficiency is high so that it becomes possible to obtain a light device.

However, when the orientation condition of emitted light, namely color distribution of light at each angle of radiated light, is examined in detail, there is a tendency in that the light radiated toward the wide-angle direction becomes dense in color, in comparison with the light radiated toward the front direction. This is because the light radiated toward the wide-angle direction passes through a long distance of the wavelength conversion layer in comparison with the front direction. Accordingly, in the case of a package having a relatively low height which is prepared using an encapsulating sheet, difference in chromaticity at respective angles, namely angle-dependency of chromaticity, is so large that difference in the chromaticity of light becomes a problem depending on the looking direction when used in illumination and the like.

In order to improve this problem, there has been proposed a dome type package in which height of the package was heightened and also the lateral part wavelength conversion layer was arranged in such a manner that it becomes perpendicular to the light emitting element (cf. Patent Document 1).

Patent Document 1: JP-A-2008-159705

SUMMARY OF THE INVENTION

The dome type package is not fully satisfactory, because it has a productive problem of being hard to prepare and is opposed to the recent tendency for thin packages. Accordingly, there is a demand for a package which can be conveniently prepared using an encapsulating sheet and also has a thin thickness and a low angle dependency.

The problem of the invention is to provide an optical-semiconductor device which can be conveniently prepared using an encapsulating sheet and also has a thin thickness and a low chromaticity angle dependency, a sheet for optical-semiconductor element encapsulation to be used in the device and a method for producing the device.

Namely, the present invention relates to the following items (1) to (4).

(1) An optical-semiconductor device, which is prepared by: arranging a sheet for optical-semiconductor element encapsulation including an encapsulating resin layer capable of embedding an optical-semiconductor element and a wavelength conversion layer containing light wavelength-converting particles and being laminated directly or indirectly on the encapsulating resin layer, on an optical-semiconductor element-mounting substrate so that the encapsulating resin layer faces the substrate; followed by compression-molding, in which the wavelength conversion layer is present on an upper part of a molded body in which the optical-semiconductor element is embedded therein, but is not present on a side surface of the molded body.

(2) The optical-semiconductor device according to (1), which satisfies the following formulae (I) and (II) when a thickness of the encapsulating resin layer is regarded as (X) (mm), an area of the sheet for optical-semiconductor element encapsulation necessary for encapsulating one optical-semiconductor element is regarded as (Y) (mm$^2$) and an area of an upper part of the optical-semiconductor element is regarded as (A) (mm$^2$):

$$0.5 \leq X \leq 2.0 \quad \text{(I)}$$

$$\{X \times \tan(75°)\}^2 \times \pi + A \leq Y \leq \{X \times \tan(80°)\}^2 \times \pi + A \quad \text{(II)}.$$

(3) A sheet for optical-semiconductor element encapsulation, including an encapsulating resin layer capable of embedding an optical-semiconductor element and a wavelength conversion layer containing light wavelength-converting particles and being laminated directly or indirectly on the encapsulating resin layer.

(4) A method for producing the optical-semiconductor device according to (1) or (2), the method including:

arranging a sheet for optical-semiconductor element encapsulation including an encapsulating resin layer capable of embedding an optical-semiconductor element and a wavelength conversion layer containing light wavelength-converting particles and being laminated directly or indirectly on the encapsulating resin layer, on an optical-semiconductor element-mounting substrate so that the encapsulating resin layer faces the substrate; and applying a pressure on a surface of the sheet for optical-semiconductor element encapsulation by using a flat face, thereby molding.

Since the optical-semiconductor device of the invention can be conveniently prepared using an encapsulating sheet and also has a thin thickness and a low chromaticity angle dependency, it can emit a light of a uniform color over all angles.

DETAILED DESCRIPTION OF THE INVENTION

Figure 1:
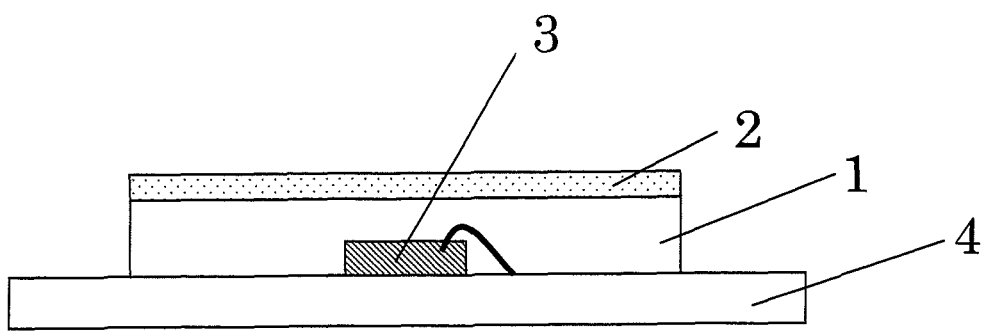
FIG. 1 is an illustration showing a cross-section of the optical-semiconductor device of Example 1.
Figure 2:
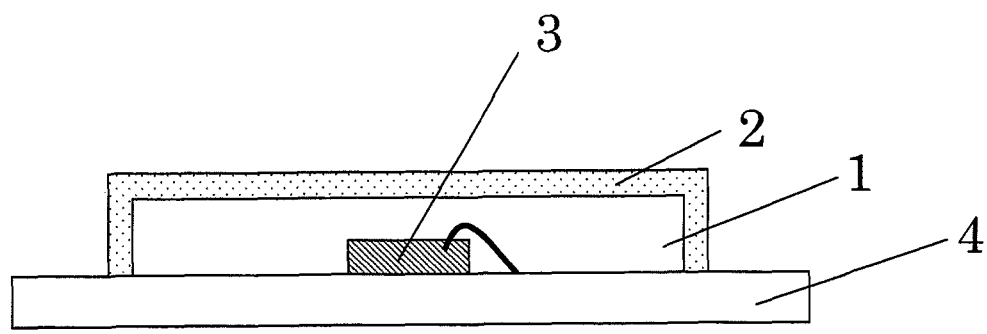
FIG. 2 is an illustration showing a cross-section of the optical-semiconductor device of Comparative Example 1.

The optical-semiconductor device of the invention is prepared by: arranging a sheet for optical-semiconductor element encapsulation including an encapsulating resin layer capable of embedding an optical-semiconductor element and a wavelength conversion layer containing light wavelength-converting particles and being laminated directly or indirectly on said encapsulating resin layer, on an optical-semiconductor element-mounting substrate so that the encapsulating resin layer faces the substrate; followed by compression-molding, and has a great characteristic of having a structure in which the wavelength conversion layer is present on an upper part of a molded body in which the optical-semiconductor element is embedded therein, but is not present on a side surface (lateral part) of the molded body.

In the case of a general package having a certain thickness of a wavelength conversion layer on the periphery (upper part and side surface) of the optical-semiconductor element, the distance where the light radiated in the facing direction (perpendicular direction to the plane of optical-semiconductor element-mounting substrate) passes through the wavelength conversion layer becomes identical to the thickness of the wavelength conversion layer. However, since the light radiated toward the wide-angle direction diagonally passes through the wavelength conversion layer, the passing distance becomes larger than the thickness of wavelength conversion layer so that the light radiated at wider angle becomes dense in color by undergoing the effect of wavelength conversion. In addition, although the distance where the light radiated in the true transverse direction (parallel direction to the optical-semiconductor element-mounting substrate) passes through the wavelength conversion layer becomes identical to the thickness of the wavelength conversion layer, the light emitted in the true transverse direction becomes dense in color in reality because it is a light repeatedly reflected in the wavelength conversion layer. Accordingly, the light radiated from such a package has a tendency of becoming dense in color as it becomes a wide-angle of from the facing direction to true transverse direction. Thus, according to the invention, by not allowing the wavelength conversion layer to be present on the package side surface (lateral part), emission of light having uniform chromaticity as a whole is obtained by radiating a light of pale color from the side surface. It is considered that this is because, although there is no wavelength conversion function at the side surface, color of the light emitted therefrom is not the same color of light emitted from the element but, as described in the above, is a mixed color with the light repeatedly reflected in the wavelength conversion layer, so that a light of almost the same color with that of the light emitted from the front face is emitted as a result. Accordingly, light of a uniform color is emitted over the all angles due to mixing of the light radiating in the diagonal direction with the pale color light radiating from the front face and the true transverse direction.

The optical-semiconductor device of the invention is prepared by batch-encapsulating using a sheet for optical-semiconductor element encapsulation, and the sheet for optical-semiconductor element encapsulation includes an encapsulating resin layer capable of embedding an optical-semiconductor element and a wavelength conversion layer containing light wavelength-converting particles.

The encapsulating resin layer is a layer which can embed an optical-semiconductor element by compression molding at the time of encapsulation, and it requires such a flexibility that it can embed the element at the time of encapsulation and also a strength that can protect the element from the outside impact at the time of its use. From such a point of view, the encapsulating resin layer requires a low elasticity (plasticity) and a property to keep its shape by curing it thereafter (post-curing property).

As a resin which constitutes an encapsulating resin layer having such characteristics, there is no particular limitation with the proviso that it has both plasticity and post-curing property, but it is desirable from the viewpoint of durability that it contains a silicone resin as the main component. In this connection, the term "main component" as used herein means a component occupying 50% or more of the components which constitute the resin layer.

As the silicone resin, silicone resins of gelled product, semi-cured product, cured product and the like can be mentioned based on the number of crosslinks in the siloxane structure and these can be used alone or in combination thereof, but a silicone resin having two reaction systems and a modified silicone resin are desirable because it is preferable that the encapsulating resin layer of the invention shows different strengths depending on the temperature, such as possession of such a flexibility that shape of the layer changes by the pressure at the time of encapsulation and also possession of such a strength that it can withstand the impact and the like when cured.

As the silicone resin having two reaction systems, for example, there may be mentioned a resin having two reaction systems of a silanol condensation reaction and an epoxy reaction and a resin having two reaction systems of a silanol condensation reaction and a hydrosilylation reaction (condensation-addition curing type silicone resin).

As the modified silicone resin, there may be mentioned a resin having a heterosiloxane structure such as borosiloxane, aluminosiloxane, phosphorsiloxane, titaniumsiloxane and the like in which Si atoms in the siloxane structure are partially substituted by B, Al, P, Ti and the like atoms, and a resin in which an organic functional group such as epoxy group is added to an Si atom in the siloxane structure. Particularly, since dimethylsiloxane has a low elastic modulus even at a high crosslinking ratio, a modified silicone resin in which hetero atoms are incorporated into dimethylsiloxane or an organic functional group is added thereto is more preferable. In this connection, in order to provide the encapsulating resin layer with the strength as described in the above, the number of crosslinks in the siloxane structure may be adjusted by a conventionally known method.

Although these resins can be produced by a conventionally known production method, the case of a condensation-addition curing type silicone resin is described. For example, a condensation-addition curing type silicone resin can be obtained by adding tetramethylammonium hydroxide as a condensation catalyst to a mixture of a dual-end silanol type silicone oil, vinyl(trimethoxy)silane as an alkenyl group-containing silane compounds and an organic solvent, mixing them while stirring at room temperature for 2 hours, and then adding thereto an organohydrogensiloxane and a platinum catalyst as the hydrosilylation catalyst, followed by mixing.

Containing amount of the silicone resin is preferably 70% by weight or more, more preferably 90% by weight or more, further preferably substantially 100% by weight, based on the resins constituting the encapsulating resin layer.

In addition to the aforementioned resins, the encapsulating resin layer may be further blended with additives such as a curing agent and a curing accelerator, as well as an antioxidant, a modifier, a surfactant, a dye, a pigment, a discoloration inhibitor, an ultraviolet ray absorbent and the like, as the materials. In this connection, even when these additives are contained, the encapsulating resin layer may be a resin layer having plasticity and post-curing property.

The encapsulating resin layer is molded into a sheet shape by coating the aforementioned resin or an organic solvent solution of the resin to form a film of an appropriate thickness on, for example, a release-treated separator (e.g., a biaxially stretched polyester film) by a method such as casting, spin coating or roll coating, and then drying the film at a temperature which does not accelerate the curing reaction but can remove the solvent. The temperature for drying the film-formed resin solution varies depending on the kinds of resin and solvent and therefore cannot be decided in a wholesale manner, but is preferably from 80° C. to 150° C., more preferably from 90° C. to 130° C. In addition, when a condensation-addition curing type silicone resin is used, the condensation reaction is accelerated by the aforementioned drying so that the obtained sheet-shaped encapsulating resin layer shows a semi-cured form.

Thickness of the sheet (X) (mm) of the encapsulating resin layer after heat drying may be 0.1 mm or more from the viewpoint that the element can be embedded. However, when thickness of the encapsulating resin layer is small, it is necessary to reduce radiation of light to the wide-angle direction in order to obtain emission of light having uniform chromaticity so that size of the sheet for optical-semiconductor element encapsulation necessary for the encapsulation becomes small. In that case, heat is transferred to the wavelength conversion layer on the upper side of the encapsulating resin layer when high electric current is applied to the device, and the temperature becomes high and causes deterioration of the device itself. In addition, when thickness of the encapsulating resin layer is large, the light directly radiated from the transverse direction becomes frequent so that the chromaticity as a whole is lowered. From such a point of view, thickness of the sheet of encapsulating resin layer (X) (mm) is preferably satisfies the following formula (I):

$$0.5 \leq X \leq 2.0 \quad (I).$$

More preferably, it satisfies $$0.85 \leq X \leq 1.5.$$

In this connection, two or more of the thus-obtained sheets can be molded as a single sheet having a thickness of within the above-mentioned range, by laminating them and subjecting to a thermal compression.

Since the encapsulating resin layer of the invention is in a sheet-shaped at ordinary temperature and must be separable from the separator, its storage elastic modulus at 23° C. is preferably $1.0 \times 10^4$ Pa or more (0.01 MPa or more), more preferably from $2.0 \times 10^4$ Pa to $1.0 \times 10^6$ Pa (from 0.02 MPa to 1.0 MPa), and its storage elastic modulus at 150° C. is preferably $1.0 \times 10^6$ Pa or less (1.0 MPa or less), more preferably from $1.0 \times 10^4$ Pa to $1.0 \times 10^5$ Pa (from 0.01 MPa to 0.1 MPa). Also, its storage elastic modulus at 23° C. after curing at 150° C. for 5 hours is preferably $1.0 \times 10^6$ Pa or more (1.0 MPa or more), more preferably from $1.0 \times 10^6$ Pa to $1.0 \times 10^7$ Pa (from 1.0 MPa to 10 MPa). In this connection, the storage elastic modulus according to this specification can be measured in accordance with the method described in Examples which is described later.

The wavelength conversion layer is a resin layer which contains light wavelength-conversing particles, and can be adjusted to a light emission of desired color by converting wavelength of a part of the light from the element and mixing it with the light emission from the element. In addition, according to the invention, it is desirable to arrange the wavelength conversion layer on the outermost side of the package from the viewpoint of inhibiting the light reflected by the wavelength conversion layer to reach the element having high refraction index.

As the light wavelength-conversing particles (phosphor) of the wavelength conversion layer, there is no particular limitation, and a conventionally known phosphor to be used in an optical-semiconductor device can be mentioned. Illustratively, a yellow phosphor (α-SIALON), YAG, TAG and the like can be exemplified as suitable commercially available phosphors having a function to convert blue color to yellow color, and $CaAlSiN_3$ and the like can be exemplified as suitable commercially available phosphors having a function to convert blue color to red color. These phosphors can be used alone or in combination thereof.

Containing amount of the light wavelength-converting particles cannot be decided in a wholesale manner because the degree of mixed colors varies depending on the thickness of the wavelength conversion layer, but when thickness of the wavelength conversion layer is 0.1 mm for example, it is desirable that containing amount of the light wavelength-converting particles is from 10 to 30% by weight.

The resin of the wavelength conversion layer is not particularly limited with the proviso that it is a resin conventionally used for the optical-semiconductor element encapsulation, and there may be mentioned a transparent resin such as an epoxy resin, an acrylic resin, a silicone resin and the like, of which a silicone resin is desirable from the viewpoint of durability.

As the silicone resin, the silicone resins exemplified in the above can be mentioned in the same manner, and those which are on the market may be used or those which are separately produced may be used.

In addition to the aforementioned resins and light wavelength-converting particles, the wavelength conversion layer may be blended with, as the materials, additives similar to the case of the encapsulating resin layer.

The wavelength conversion layer is molded into a sheet shape by coating the aforementioned resin containing light wavelength-converting particles or an organic solvent solution of the resin to form a film of an appropriate thickness on, for example, a release-treated separator (e.g., a polyester film or polypropylene film) by a method such as casting, spin coating or roll coating, and then drying the film at a temperature which does not accelerate the curing reaction but can remove the solvent. The temperature for drying the film-formed resin solution varies depending on the kinds of resin and solvent and therefore cannot be decided in a wholesale manner, but is preferably from 80° C. to 150° C., more preferably from 90° C. to 150° C.

From the viewpoint of improving the light-extraction efficiency, the sheet thickness of the wavelength conversion layer after heat drying is preferably from 0.05 mm to 0.2 mm, more preferably from 0.07 mm to 0.12 mm. In this connection, two or more of the thus-obtained sheets can be molded as a single sheet having a thickness of within the above-mentioned range, by laminating them and subjecting to a thermal compression. In addition, in that case, the molding may be carried out using two or more wavelength conversion layers containing different kinds of light wavelength-converting particles.

Storage elastic modulus of the wavelength conversion layer at 150° C. is preferably $1.0 \times 10^5$ Pa or more (0.1 MPa or more), more preferably from $1.0 \times 10^6$ Pa to $1.0 \times 10^8$ Pa (from 1.0 MPa to 100 MPa), because color of the package changes when the layer is deformed.

As the method for laminating the encapsulating resin layer and wavelength conversion layer, there is no particular limitation, and for example, there may be mentioned a method in which, when the encapsulating resin layer is molded into a sheet shape, the encapsulating resin layer is directly molded and laminated on the molded wavelength conversion layer. In this connection, the term "directly laminated" sheet as used herein means a sheet which is formed through direct lamination of the encapsulating resin layer and wavelength conversion layer, and the "indirectly laminated" sheet means a sheet which is formed by laminating the encapsulating resin layer and wavelength conversion layer via other layer interposed between them in accordance with a general method.

The optical-semiconductor device of the invention is obtained by arranging the thus-obtained sheet for optical-semiconductor element encapsulation on an optical-semiconductor element-mounting substrate in such a manner that the encapsulating resin layer faces the substrate, followed by compression-molding.

The optical-semiconductor element to be used in the invention is not particularly limited with the proviso that it is generally used in an optical-semiconductor device, and for example, there may be mentioned gallium nitride (GaN, refraction index: 2.5), gallium phosphorus (GaP, refraction index: 2.9), gallium arsenic (GaAs, refraction index: 3.5) and the like, of which GaN is desirable from the viewpoint that it emits blue light and can produce white LED via a phosphor.

The substrate on which an optical-semiconductor element is mounted is not particularly limited too, but for example, there may be mentioned a metal substrate, a rigid substrate in which a cupper wiring is laminated on a glass-epoxy substrate, a flexible substrate in which a cupper wiring is laminated on a polyimide film, and the like, and any shapes such as a plate, a rugged plate and the like can be used.

As the method for mounting an optical-semiconductor element on the substrate, there may be mentioned a face up mounting method suitable for mounting an optical-semiconductor element in which an electrode is arranged on the light emission side, a flip lip mounting method suitable for mounting an optical-semiconductor element in which an electrode is arranged on the other side of the light emission side, and the like.

As the molding method, it is necessary to applying a pressure on a surface of the sheet for optical-semiconductor element encapsulation by using such a flat face that the wavelength conversion layer of a sheet for optical-semiconductor element encapsulation is not arranged on the side surface of the package, but there is no particular limitation other than that. As an illustrative method, a method for carrying out a thermal compression using a press is described. For example, a sheet for optical-semiconductor element encapsulation having a predetermined size is arranged on an optical-semiconductor element-mounting substrate and compression-molded using a press at a temperature of preferably from 100° C. to 200° C. The pressure to be loaded cannot be decided in a wholesale manner depending on the characteristics of the encapsulating resin layer, but since there is a concern of causing deformation of the encapsulating resin layer when too much load is applied thereto, it is desirable to carry out the compression using a press which can control height of the molded body to be obtained and for example, the compression can be carried out by setting height of the upper plate of a flat mold to a value of about 0.1 mm smaller than the total thickness of the sheet. As such a press, a heating press "CYTP-10" manufactured by SINTO KOGIO, LTD., and the like can be used.

Size of the sheet for optical-semiconductor element encapsulation to be used cannot be decided in a wholesale manner depending on the thickness of the wavelength conversion layer, but when it is large, the wide-angle chromaticity becomes dense due to large activity of the wavelength conversion action, and when it is small, the wide-angle chromaticity becomes thin. Accordingly, the present inventors have made an examination and it was found as a result that the size of sheet in which the chromaticity becomes uniform is such a size that about 80% of the beam radiated from the element passes through the wavelength conversion layer. The size through which about 80% of the beam passes through the wavelength conversion layer is, for example, within the range of from 75 degree to 80 degree (°) for right and left respectively when front face of the element is regarded as zero degree (°). Therefore, it is desirable to satisfy the following formula (II) when a thickness of the encapsulating resin layer is regarded as (X) (mm), an area of the sheet for optical-semiconductor element encapsulation necessary for encapsulating one optical-semiconductor element is regarded as (Y) (mm$^2$) and an area of an upper part of the optical-semiconductor element is regarded as (A) (mm$^2$).

$$\{X \times \tan(75°)\}^2 \times \pi + A \leq Y \leq \{X \times \tan(80°)\}^2 \times \pi + A \quad (II)$$

In this case, "A" means an area of upper part (upper side) of the optical-semiconductor element, "$\{X \times \tan(75°)\}^2 \times \pi$" means an area of the circle where the light of beam of from 0 degree to 75 degree (°) passes through, and "$\{X \times \tan(80°)\}^2 \times \pi$" means an area of the circle where the light of beam of from 0 degree to 80 degree (°) passes through. Shape of the sheet is not particularly limited with the proviso that it has the aforementioned area.

The optical-semiconductor device of the invention is obtained by leaving the thus-molded package until its shape is not changed even at room temperature and then carrying out post curing by thermal compression for a period of time necessary for the curing of the encapsulating resin layer. The optical-semiconductor device of the invention can be batch-encapsulated using the sheet for optical-semiconductor element encapsulation, and the wavelength conversion layer of the sheet is positioned at the outermost layer of the package and is present on the upper part of the element but is not present on the side surface, so that it is able to obtain emission of light having excellent light-extraction efficiency and uniform chromaticity. Accordingly, the invention provides a sheet for optical-semiconductor element encapsulation which is used for the optical-semiconductor device of the invention.

The sheet of the invention for optical-semiconductor element encapsulation has an encapsulating resin layer capable of embedding the optical-semiconductor element and a wavelength conversion layer containing light wavelength-converting particles, and from the viewpoint of unifying chromaticity of light emission, it is possible to optionally set its size in response to the size of light emitting element of the optical-semiconductor device to be used.

In addition, since batch encapsulation can be carried out using the aforementioned sheet of the invention for optical-semiconductor element encapsulation, the invention provides a method for producing an optical-semiconductor device using the sheet of the invention for optical-semiconductor element encapsulation. The production method is not particularly limited with the proviso that it includes: a step of arranging the sheet of the invention for optical-semiconductor element encapsulation on an optical-semiconductor element-mounting substrate so that the encapsulating resin layer faces the substrate; and a step of applying a pressure on a surface of the sheet for optical-semiconductor element encapsulation by using a flat face, thereby molding. Illustratively, there may be mentioned a method in which the sheet of the invention for optical-semiconductor element encapsulation is arranged in such a manner that the encapsulating resin layer faces the optical-semiconductor element-mounting substrate and is compression-molded using a press having a flat face such as a flat mold, at a temperature of preferably from 100° C. to 200° C.

Since the optical-semiconductor device of the invention obtained in this manner is excellent in light-extraction efficiency and can produce light emission of uniform chromaticity, it can be suitably used as an optical-semiconductor light emission device.

EXAMPLES

The following describes the invention based on examples, though the invention is not restricted by these examples.
[Storage Elastic Modulus of Resin Layer]
A sheet having a thickness of about 1 mm was molded by laminating a plurality of sheets of respective resin layers, and measurement of viscoelasticity at the time of shearing was carried out using a dynamic viscoelasticity measuring device (DMS-200, mfd. by SII Nano Technology, Inc.) to calculate storage elastic modulus at 23° C. and 150° C.

Production Example 1 of a Sheet for
Optical-Semiconductor Element Encapsulation

A yellow phosphor (YAG) was added to a silicone elastomer (mfd. by WACKER ASAHI KASEI SILICONE CO., LTD, trade name "LR 7556") solution to a particle density of 20% by weight and stirred for 1 hour. The thus-obtained solution was coated on a polyester film (mfd. by Mitsubishi Polyester Chemical Co., Ltd. MRN 38 μm) to a thickness of 0.10 mm and dried at 120° C. for 5 minutes to obtain a wavelength conversion layer (0.10 mm in thickness).

Next, 0.32 ml (0.35 mmol) of a tetramethylammonium hydroxide aqueous solution (10% by weight in concentration) was added to a mixture of 200 g (17.4 mmol) of a dual-end silanol type silicone oil, 1.75 g (11.8 mmol) of vinyl trimethoxy silane and 20 ml of 2-propanol and stirred at room temperature (25° C.) for 2 hours. A 1.50 g of organohydrogenpolysiloxane and 1.05 ml of a platinum carbonyl complex solution (platinum concentration: 2% by weight) were added to the thus-obtained oil and stirred to be used as an encapsulating resin layer solution.

By coating the thus-obtained encapsulating resin layer solution on the wavelength conversion layer obtained in the above (0.10 mm in thickness) and drying it at 80° C. for 30 minutes, a sheet for optical-semiconductor element encapsulation A was obtained (1.10 mm in thickness).

Production Example 2 of a Sheet for
Optical-Semiconductor Element Encapsulation

A sheet for optical-semiconductor element encapsulation B (0.60 mm in thickness) was obtained in the same manner as in Production Example 1, except that coating thickness of the encapsulating resin layer solution was changed from 1.0 mm to 0.5 mm.

Production Example 3 of a Sheet for
Optical-Semiconductor Element Encapsulation

A sheet for optical-semiconductor element encapsulation C (0.90 mm in thickness) was obtained in the same manner as in Production Example 1, except that coating thickness of the encapsulating resin layer solution was changed from 1.0 mm to 0.8 mm.

Production Example 4 of a Sheet for
Optical-Semiconductor Element Encapsulation

A yellow phosphor (YAG) was added to a silicone elastomer (LR 7556) solution to a particle density of 20% by weight and stirred for 1 hour. The thus-obtained solution was coated on a polypropylene film (mfd. by TOHCELLO Co, Ltd., Y-3s, 30 μm) to a thickness of 0.10 mm and dried at 120° C. for 5 minutes to obtain a wavelength conversion layer (0.10 mm in thickness). A sheet for optical-semiconductor element encapsulation D (1.10 mm in thickness) was obtained in the same manner as in Production Example 1, except that the thus-obtained wavelength conversion layer was used.

Examples 1 to 9 and Comparative Example 1

The sheets for optical-semiconductor element encapsulation shown in Table 1 were stamped out using a Thomson blade into the sizes shown in Table 1, put on respective optical-semiconductor elements in such a manner that the encapsulating resin layer faced the optical-semiconductor element-mounting substrate and then pressed using a heating press (mfd. by SINTO KOGIO, LTD.) at 150° C. for 3 minutes with a flat mold to the respective heights shown in Table 1. Also, the optical-semiconductor device of Comparative Example 1 was prepared in the same manner as in Example 1, except that a concave type mold (8 mm×8 mm) was used. In this connection, regarding the substrate, a material in which a blue LED element (1 mm×1 mm) is mounted on the center of a metal substrate of 2 cm×3 cm in size was used.

Characteristics of the thus-obtained optical-semiconductor devices were evaluated in accordance with the following Test Examples 1 and 2. The results are shown in Table 1.

Test Example 1

Chromaticity Angle Dependency

By applying an electric current of 50 mA to the optical-semiconductor device, emitted light of each angle was detected using a spectrophotometer (MCPD-3000, mfd. by Otsuka Electronics Co., Ltd.) and the chromaticity was expressed by the CIE chromaticity indexes (x, y). Among the emitted lights of from 0° (front face) to 80°, a difference between maximum value and minimum value of the CIE chromaticity (y) value was calculated as the difference in chromaticity and the chromaticity angle dependency was evaluated in accordance with the following evaluation criteria. In this connection, smaller difference in chromaticity means smaller chromaticity angle dependency.
<Evaluation Criteria of Chromaticity Angle Dependency>
  A: Difference in chromaticity is less than 0.030
  B: Difference in chromaticity is 0.030 or more and less than 0.060
  C: Difference in chromaticity is 0.060 or more

Test Example 2

Wavelength Conversion Characteristics

After mounting the optical-semiconductor device on a heat sink made of copper, an electric current of 1 A was applied thereto and temperature on the device surface was measured using a thermographic device (CPA 1000, mfd. by CINO) to evaluate the wavelength conversion characteristics. In this connection, the wavelength conversion characteristics become inferior when surface temperature of the package exceeds 120° C. because wavelength conversion efficiency of the phosphor is lowered.

TABLE 1

| | | Ex. 1 | Ex. 2 | Ex. 3 | Ex. 4 | Ex. 5 |
|---|---|---|---|---|---|---|
| Optical-semiconductor device | | | | | | |
| Area of LED element (A, mm$^2$) | | 1 | 1 | 1 | 1 | 1 |
| Sheet for optical-semiconductor element encapsulation | | | | | | |
| Kind of sheet for optical-semiconductor element encapsulation | | A | A | A | A | A |
| Thickness of encapsulating resin layer (X, mm) | | 1.0 | 1.0 | 1.0 | 1.0 | 1.0 |
| Storage modulus of elasticity of encapsulating resin layer (150° C., Pa) | | $8.0 \times 10^4$ | $8.0 \times 10^4$ | $8.0 \times 10^4$ | $8.0 \times 10^4$ | $8.0 \times 10^4$ |
| Thickness of wavelength conversion layer (mm) | | 0.10 | 0.10 | 0.10 | 0.10 | 0.10 |
| Storage modulus of elasticity of wavelength conversion layer (150° C., Pa) | | $1.0 \times 10^6$ | $1.0 \times 10^6$ | $1.0 \times 10^6$ | $1.0 \times 10^6$ | $1.0 \times 10^6$ |
| Separator used in wavelength conversion layer preparation | | PE[2] film | PE film | PE film | PE film | PE film |
| Sheet size at the time of stamping | | 12 × 12 | 10 × 10 | 8 × 8 | 6 × 6 | 5 × 5 |
| Sheet area at the time of encapsulation (Y, mm$^2$)[1] | | 144 | 100 | 64 | 36 | 25 |
| {X × tan(75°)}$^2$ × π + A | | 45 | 45 | 45 | 45 | 45 |
| {X × tan(80°)}$^2$ × π + A | | 102 | 102 | 102 | 102 | 102 |
| Mold at the time of pressing | | Flat mold | Flat mold | Flat mold | Flat mold | Flat mold |
| Height of device (mm) | | 1.04 | 1.04 | 1.04 | 1.04 | 1.04 |
| Characteristics | | | | | | |
| Chromaticity angle dependency | Difference in chromaticity (CIE, y) | 0.041 | 0.021 | 0.026 | 0.045 | 0.046 |
| | Judgment | B | A | A | B | B |
| Wavelength conversion characteristics | Device surface temp. (° C.) | 114 | 114 | 115 | 117 | 125 |

| | | Ex. 6 | Ex. 7 | Ex. 8 | Ex. 9 | Comp. Ex. 1 |
|---|---|---|---|---|---|---|
| Optical-semiconductor device | | | | | | |
| Area of LED element (A, mm$^2$) | | 1 | 1 | 1 | 1 | 1 |
| Sheet for optical-semiconductor element encapsulation | | | | | | |
| Kind of sheet for optical-semiconductor element encapsulation | | A | B | C | D | D |
| Thickness of encapsulating resin layer (X, mm) | | 1.0 | 0.5 | 0.8 | 1.0 | 1.0 |
| Storage modulus of elasticity of encapsulating resin layer (150° C., Pa) | | $8.0 \times 10^4$ | $8.0 \times 10^4$ | $8.0 \times 10^4$ | $8.0 \times 10^4$ | $8.0 \times 10^4$ |
| Thickness of wavelength conversion layer (mm) | | 0.10 | 0.10 | 0.10 | 0.10 | 0.10 |
| Storage modulus of elasticity of wavelength conversion layer (150° C., Pa) | | $1.0 \times 10^6$ | $1.0 \times 10^6$ | $1.0 \times 10^6$ | $1.0 \times 10^6$ | $1.0 \times 10^6$ |
| Separator used in wavelength conversion layer preparation | | PE film | PE film | PE film | PP[3] film | PP film |
| Sheet size at the time of stamping | | 10 φ | 5 × 5 | 7 × 7 | 12 × 12 | 10 × 10 |
| Sheet area at the time of encapsulation (Y, mm$^2$)[1] | | 79 | 25 | 49 | 144 | 64 |
| {X × tan(75°)}$^2$ × π + A | | 45 | 12 | 29 | 45 | 45 |
| {X × tan(80°)}$^2$ × π + A | | 102 | 26 | 66 | 102 | 102 |
| Mold at the time of pressing | | Flat mold | Flat mold | Flat mold | Flat mold | Concave (8 mm × 8 mm) |
| Height of device (mm) | | 1.04 | 0.54 | 0.84 | 1.03 | 1.03 |
| Characteristics | | | | | | |
| Chromaticity angle dependency | Difference in chromaticity (CIE, y) | 0.022 | 0.024 | 0.023 | 0.041 | 0.065 |
| | Judgment | A | A | A | B | C |

TABLE 1-continued

| | | | | | | |
|---|---|---|---|---|---|---|
| Wavelength conversion characteristics | Device surface temp. (° C.) | 115 | 130 | 116 | 114 | 115 |

[1] Area of sheet for optical-semiconductor element encapsulation (mm$^2$) necessary for encapsulating one optical-semiconductor element;
[2] Polyester;
[3] polypropylene As a result, it can be seen that the optical-semiconductor devices of the examples can produce emission of a light having small chromaticity angle dependency and uniform chromaticity in comparison with that of the comparative example. Particularly, further small chromaticity angle dependency can be obtained by the optical-semiconductor devices obtained using a sheet for optical-semiconductor element encapsulation having a sheet area of within the range calculated based on the thickness of the encapsulating resin layer.

While the invention has been described in detail with reference to specific embodiments thereof, it will be apparent to one skilled in the art that various changes and modifications can be made therein without departing from the spirit and scope thereof.

Incidentally, the present application is based on Japanese Patent Application No. 2010-021478 filed on Feb. 2, 2010, and the contents are incorporated herein by reference.

All references cited herein are incorporated by reference herein in their entirety.

Also, all the references cited herein are incorporated as a whole.

Since the optical-semiconductor device of the invention is small in chromaticity angle dependency, it can be suitably used, for example, in the backlight of an image plane, a signal, an outdoor large display, an advertising signboard and the like.

DESCRIPTION OF THE REFERENCE NUMERALS

1 Encapsulating resin layer
2 Wavelength conversion layer
3 Optical-semiconductor element
4 Substrate

What is claimed is:

1. An optical-semiconductor device comprising
a substrate,
an optical-semiconductor element on the substrate,
a compression molded body comprising a two-step cured encapsulating resin layer comprising a condensation-addition curing type silicone resin in an amount of 50% or more of components constituting the encapsulating layer, and a wavelength conversion layer containing light wavelength-converting particles,
wherein the wave conversion layer is laminated directly or indirectly on said encapsulating resin layer,
the encapsulating resin layer embeds the optical-semiconductor element,
the wavelength conversion layer is not present in a side surface of said molded body, and
the optical-semiconductor device satisfies the following formulae (I) and (II) when a thickness of the encapsulating resin layer is regarded as (X) (mm), an area of the sheet for optical-semiconductor element encapsulation necessary for encapsulating one optical-semiconductor element is regarded as (Y) (mm$^2$) and an area of an upper part of the optical-semiconductor element is regarded as (A) (mm$^2$):

$$0.5 \leq X \leq 2.0 \tag{I}$$

$$\{X \times \tan(75°)\}^2 \times \pi + A \leq Y \leq \{X \times \tan(80°)\}^2 \times \pi + A \tag{II}$$

2. The optical-semiconductor device according to claim 1, wherein the wavelength conversion layer has a storage elastic modulus at 150° C. of $1.0 \times 10^5$ to $1.0 \times 10^8$ Pa.

3. The optical-semiconductor device according to claim 1, wherein the wavelength conversion layer has a storage elastic modulus at 150° C. of $1.0 \times 10^4$ to $1.0 \times 10^6$ Pa.

4. A method for producing the optical-semiconductor device according to claim 1, said method comprising: arranging a sheet for optical-semiconductor element encapsulation comprising an encapsulating resin layer capable of embedding an optical-semiconductor element and a wavelength conversion layer containing light wavelength-converting particles and being laminated directly or indirectly on said encapsulating resin layer, on an optical-semiconductor element-mounting substrate so that said encapsulating resin layer faces said substrate; and applying a pressure on a surface of the sheet for optical-semiconductor element encapsulation by using a flat face, thereby molding.

* * * * *